United States Patent [19]

Orii et al.

[11] Patent Number: 4,557,184
[45] Date of Patent: Dec. 10, 1985

[54] CLEAN BENCH

[75] Inventors: Ken Orii, Yachiyo; Takao Kawakami, Kitamoto, both of Japan

[73] Assignee: Yamato Scientific Co., Ltd., Japan

[21] Appl. No.: 541,563

[22] Filed: Oct. 13, 1983

[30] Foreign Application Priority Data

Oct. 15, 1982 [JP]  Japan ................. 57-181035

[51] Int. Cl.⁴ ............................................. F23J 11/00
[52] U.S. Cl. .............................. 98/115.3; 55/DIG. 18
[58] Field of Search ................ 73/204; 98/39, 115 R, 98/115 LH, 115 SB; 417/43; 55/210, DIG. 18

[56] References Cited

U.S. PATENT DOCUMENTS

| | | | |
|---|---|---|---|
| 3,518,814 | 7/1970 | Maynard | 417/43 X |
| 3,811,250 | 5/1974 | Fowler, Jr. | 98/115 LH X |
| 4,174,065 | 11/1979 | Knauth | 417/43 X |
| 4,254,659 | 3/1981 | Benedetto et al. | 73/204 X |
| 4,418,568 | 12/1983 | Surman | 73/204 X |

Primary Examiner—Harold Joyce
Attorney, Agent, or Firm—Wigman & Cohen

[57] ABSTRACT

Clean bench having an outlet wind velocity measuring apparatus for the filter. The measuring apparatus comprises an air duct on a downstream of the filter, a rectifier means at the passage of the air duct, and a wind velocity sensor for detecting the velocity of the outlet wind rectified by the rectifier means.

4 Claims, 4 Drawing Figures

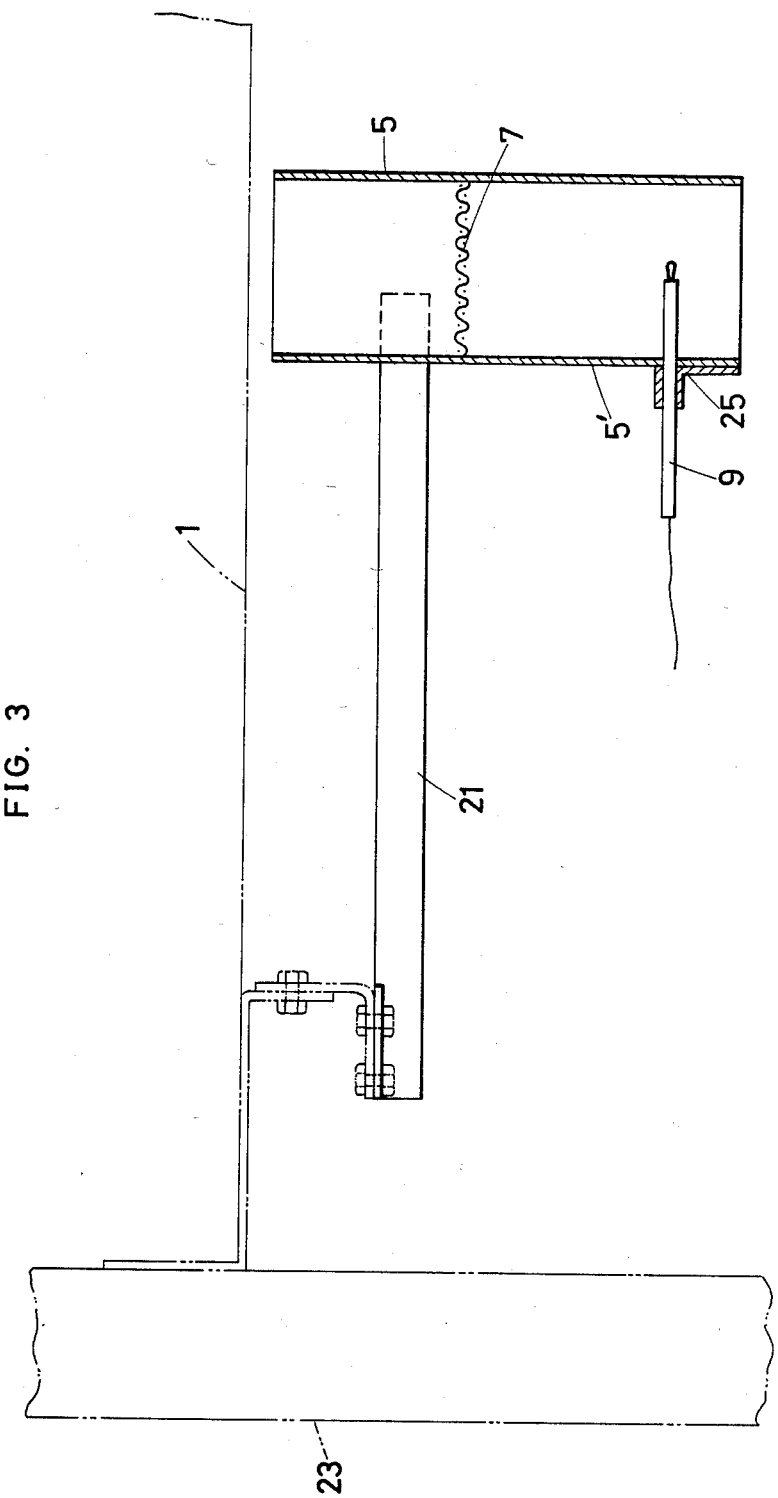

CLEAN BENCH

BACKGROUND OF THE INVENTION

The present invention relates to an outlet wind velocity measuring apparatus for a filter that is used in a clean bench.

Conventionally, it has been desirable for measurement of the wind velocity in a work space of the clean bench to carry out at the wind outlet side of filter.

However, if the filter has a complicated structure such as, for instance, a high capability one in which each filter element is offset to form a corrugated shape from air intake side to air outlet side, thereby providing a greater filtering area, there has been a problem that such a corrugated structure can cause the outlet wind velocity to vary at the air outlet side in the direction along the filter (that is, in the direction transversely crossing the air flow) and thus it is not possible to measure the wind velocity correctly.

Therefore, it has been suggested for measuring the wind velocity of the filter having the complicated structure as mentioned above to employ a method of detecting a volume of wind at the filter inlet side and of converting this value into the wind velocity, or in the case of measuring the wind velocity at the air outlet side, its measurement has been made at a position relatively remote from the filter's underside. The former method has a problem that greater fluctuations in the measurement values impair results of measurement, while the latter method is also problematic in that necessity of installing a measuring apparatus within the working space inevitably sacrifices the space available for the working operation.

SUMMARY OF THE INVENTION

An object of the present invention is to provide a clean bench which has an outlet wind velocity measuring apparatus adapted to uniform the outlet wind velocity that is otherwise made variable by the structure of filter, thereby making it possible to correctly measure the outlet wind velocity at the filter's outlet side.

Another object of the present invention is to provide a clean bench which has an outlet wind velocity measuring apparatus adapted to secure an ample space available for the working operation at the filter's air outlet side.

These and other objects and advantages of the present invention are accomplished by a provision of an outlet wind velocity measuring apparatus for a filter, wherein an air duct having a passage of suitable cross-sectional area adequate for the outlet wind flowing from the filter to pass is vertically secured to the filter's outlet side, the outlet side being formed in a corrugated shape by offsetting filter elements from air intake side to air outlet side, the passage of the air duct is provided with a flow rectifier or airflow straightener adapted to rectify the flow of outlet wind passing through the passage, and the rectifier is provided at its air outlet side thereof with a wind velocity sensor adapted to detect the outlet wind velocity rectified by the rectifier.

BRIEF DESCRIPTION OF THE DRAWINGS

These and other objects, features and advantages of the present invention will become more apparent upon a reading of the following detailed description and drawings in which:

FIGS. 2, 3 and 4 are respectively an elevational view, a side view and a rear elevation of the outlet wind velocity measuring apparatus.

DETAILED DESCRIPTION OF THE INVENTION

Figure 1:
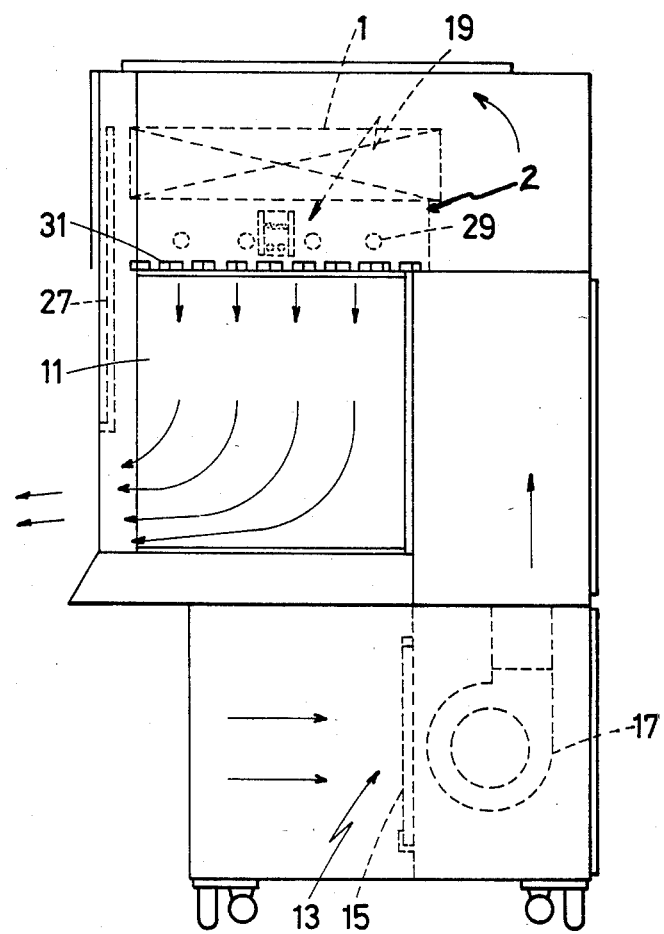
FIG. 1 is an elevational view and side view of a clean bench equipped with the measuring apparatus constructed in accordance with the present invention.

With reference to FIG. 1, the clean bench is constructed such that it can feed a clean air vertically to the working space 11. That is, the clean bench is constructed in such way that it can draw an air via a prefilter 15 from an air inlet port 13 defined at the lower side thereof, and after a thorough removal of dirt, vertically feed the clean and asceptic air to the working space with a subsequent discharge thereof out of the front. For its corrugated structure of offsetting filter elements from air inlet side to air outlet side, the filter 1 ensures greater filtering area.

Figure 2:
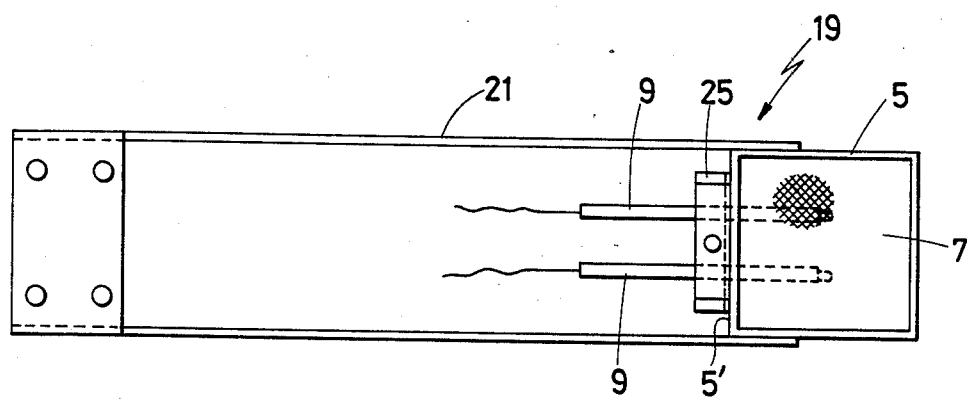
Figure 4:
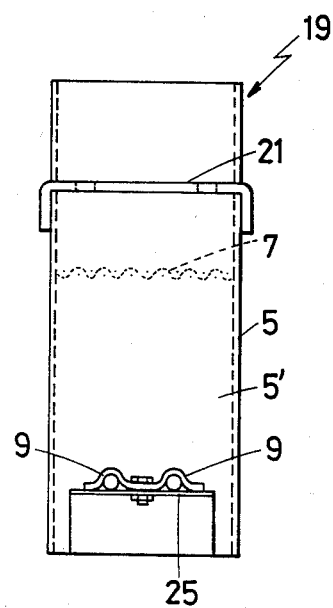

The filter 1 is provided at the air inlet side thereof with an outlet wind measuring apparatus adapted to measure the velocity of outlet wind flown from the filter 1. A defined air space 2 is located on the output side of the filter. As shown in FIGS. 2, 3 and 4, the outlet wind velocity measuring apparatus 19 has the air duct 5 including the passage of suitable cross-sectional area (squarely shaped in the embodiment shown) vertically secured to the outlet side of the filter 1 in a close relationship with the filter 1, and being supported by a machine frame 23 via a support frame 21.

Tensionally horizontally mounted with the passage of the air duct 5 is a rectifier 7 or airflow straightener adapted to rectify the flow of air passing through the passage. The rectifier 7 is made of, as for example, a stainless steel wire gauze having outside diameter of 0.5 mm and pitch size of 1.8 mm.

The rectifier 7 is provided at the lower portion thereof a wind velocity sensor 9 such as a hot-wire anemometer and the like capable of detecting the outlet wind velocity rectified by the rectifier 7. The wind velocity sensor 9 is supported by a support bracket 25 provided at the side wall 5' of the air duct 5 and is interposed into the passage.

Though not shown in Figures, a controlling means is provided to connect the wind velocity measuring apparatus to the air blower. The controlling means function to compare the wind velocity detected by the wind velocity sensor 9 with the predetermined wind velocity, and if there is any discrepancy between the two values, it further controls the air blower automatically for increasing or slowing down its r.p.m. Furthermore, the controlling means is adapted to produce an alarm upon a minimum wind velocity being detected.

There are further arranged a shutter 27, a fluorescent lamp 29 respectively provided at the front and upper portions of the working space 11, and a light diffuser 31.

Several functions attainable by the present invention will be described hereinbelow.

The air drawn via the prefilter 15 from the air inlet port 13 provided at the lower portion of the clean air bench is blown by the air blower 17 to pass through the filter 1 to the air outlet side. Despite a tendency for the outlet wind velocity to vary and fluctuate under the influence of filter's structure, use of the air duct 5 can serve to uniform the fluctuating wind velocity by the rectifier 7 which functions to rectify the air flow while passing through the passage in the air duct. The wind velocity sensor 9 detects the velocity of outlet wind thus uniformed, thereby making it possible to correctly measure the outlet wind velocity at the air outlet side of filter 1.

Measurement results of the outlet wind velocity taken at a fixed point of the secondary side of the HEPA filter, used as a filter 1 are given below, comparing the results of the case where the wind velocity sensor 9 is installed directly with those of the case where the wind velocity sensor 9 is installed via the outlet wind velocity measuring apparatus constructed in accordance with the present invention.

| Installing Condition of Wind Velocity sensor | Variance at Fixed Point | Lateral Fluctuation | Longitudinal Fluctuation |
|---|---|---|---|
| Without wind velocity measuring apparatus | ±0.01 0.57 (m/s) | 0.07 (m/s) | 0.10 (m/s) |
| With wind velocity measuring apparatus installed (as embodyed) | ±0.005 0.36 (m/s) | 0.02 (m/s) | 0.01 (m/s) |

As apparent from the above table, variance in the outlet wind velocity by positions can be uniformed to 1/3.5 to 1/10 times less in the case where the wind velocity sensor 9 is installed via the outlet wind velocity measuring apparatus 19, compared to the case where the wind velocity sensor is installed directly.

In addition, the clean bench with the wind velocity measuring apparatus secured to the understream of the filter, and is equipped with the controlling means adapted to control the r.p.m. of the air blower in response to the wind velocity detected by the wind velocity sensor 3, can afford the effects as undermentioned.

a. By providing the wind velocity sensor upwardly of the working space at the understream of the filter, the wind velocity at the working space can be directly detected, making it possible to correctly detect the air current condition.

b. A provision of a controlling means adapted to control the r.p.m. of the air blower by comparing the wind velocity detected with the predetermined value can permit the wind velocity at the working space to be kept at constant as predetermined, thereby realizing a stable air current condition.

c. In the case that the operation is carried out with the shutter slightly opened, the filter can extend its working life by predeterming the wind velocity lower than usual beforehand.

Meanwhile, the present invention is not limited its application merely to the embodiment mentioned as above, but the air duct, as for example, may be constructed with its cross-sectional area as circular.

As apparent from the foregoing description, the construction in accordance with the present invention can serve to uniform the outlet wind velocity that may otherwise be functuated at the air outlet side of the filter wherein filter elements are offset to form a corrugated shape from air intake side to air outlet side. Therefore, it becomes possible for the wind velocity sensor to be mounted closely to the filter, and to obtain a correct wind velocity simultaneously. As a result, the working space to be formed at the air outlet side of the filter can be made ample.

What is claimed is;

1. An outlet wind velocity measuring apparatus for a filter provided in a clean bench, comprising:
    a defined air space vertically arranged at the air outlet side of said filter;
    an air duct mounted within said defined air space and having its opposite open ends oriented in an air flowing direction;
    an airflow straightener means provided at an intermediate position within said air duct; and
    a wind velocity sensor provided within the air duct at the air outlet side of the airflow straightener means;
    said wind velocity sensor adapted to detect the velocity of the outlet wind straightened by the airflow straightener means.

2. The outlet wind velocity measuring apparatus of claim 1, wherein said rectifier airflow straightener means is a steel wire gauze.

3. The outlet wind velocity measuring apparatus of claim 2, wherein the diameter of the wire forming said wire gauze is less than 0.5 mm and the pitch of said wire gauze is more than 1.8 mm.

4. The outlet wind velocity measuring apparatus of claim 1 wherein said air duct is supported on the inside wall of said clean bench by a support frame.

* * * * *

UNITED STATES PATENT AND TRADEMARK OFFICE
CERTIFICATE OF CORRECTION

PATENT NO. : 4,557,184
DATED : December 10, 1985
INVENTOR(S) : KEN ORII ET AL

It is certified that error appears in the above—identified patent and that said Letters Patent is hereby corrected as shown below:

Claim 2, Column 4, line 36, delete "rectifier".

Signed and Sealed this

Thirteenth Day of May 1986

[SEAL]

Attest:

Attesting Officer

DONALD J. QUIGG

Commissioner of Patents and Trademarks